US009539727B2

(12) United States Patent
Kitahara et al.

(10) Patent No.: US 9,539,727 B2
(45) Date of Patent: Jan. 10, 2017

(54) INDUSTRIAL ROBOT WITH ELEVATING MECHANISM AND ARM-ELEVATING MECHANISM

(71) Applicant: NIDEC SANKYO CORPORATION, Suwa-gun, Nagano (JP)

(72) Inventors: Yasuyuki Kitahara, Nagano (JP); Toshimichi Kazama, Nagano (JP); Tamotsu Kuribayashi, Nagano (JP); Masayoshi Saichi, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 14/896,788

(22) PCT Filed: Aug. 6, 2014

(86) PCT No.: PCT/JP2014/070735
§ 371 (c)(1),
(2) Date: Dec. 8, 2015

(87) PCT Pub. No.: WO2015/020088
PCT Pub. Date: Feb. 12, 2015

(65) Prior Publication Data
US 2016/0136818 A1  May 19, 2016

Related U.S. Application Data

(60) Provisional application No. 61/864,272, filed on Aug. 9, 2013.

(30) Foreign Application Priority Data

Nov. 29, 2013  (JP) .................................. 2013-247027
Nov. 29, 2013  (JP) .................................. 2013-247028

(51) Int. Cl.
*B25J 9/04* (2006.01)
*B25J 11/00* (2006.01)
(Continued)

(52) U.S. Cl.
CPC ............. *B25J 11/0095* (2013.01); *B25J 9/042* (2013.01); *B25J 9/044* (2013.01); *B25J 18/04* (2013.01);
(Continued)

(58) Field of Classification Search
CPC ................................... B25J 9/042; B25J 9/044
See application file for complete search history.

(56) References Cited

U.S. PATENT DOCUMENTS 1,903,916 A * 4/1933 Stenhouse ............... C03B 35/12
414/744.3
4,428,710 A * 1/1984 Grisebach .................. B25J 9/04
414/744.5
(Continued)

FOREIGN PATENT DOCUMENTS

JP  2008264980 A  11/2008
JP  2011230256 A  11/2011
(Continued)

OTHER PUBLICATIONS

International Search Report corresponding to Application No. PCT/JP2014/070735; Date of Mailing: Sep. 30, 2014, with English translation.

*Primary Examiner* — Gerald McClain
(74) *Attorney, Agent, or Firm* — Cantor Colburn LLP

(57) ABSTRACT

An industrial robot includes a robot main body and an elevating mechanism to raise and lower the robot main body. The robot main body may include a hand, an arm to which the hand is joined, a main body portion to which the arm is joined, and an arm-elevating mechanism. The center of
(Continued)

rotation on the base end side of the arm may be located farther toward the third direction side than the center of the main body unit when viewed in the up-down direction. In the standby state, part of the arm may be positioned farther toward the fourth direction side than the main body unit. The main body unit may be secured to the elevating mechanism. The elevating mechanism may be arranged on one or both sides of the main body unit in the first direction and/or on the fourth direction side.

4 Claims, 8 Drawing Sheets

(51) Int. Cl.
  *H01L 21/687* (2006.01)
  *H01L 21/677* (2006.01)
  *B65G 47/90* (2006.01)
  *B25J 18/04* (2006.01)

(52) U.S. Cl.
  CPC ............ *B65G 47/90* (2013.01); *B65G 47/902* (2013.01); *H01L 21/67766* (2013.01); *H01L 21/67778* (2013.01); *H01L 21/67781* (2013.01); *H01L 21/68707* (2013.01); *Y10S 901/14* (2013.01); *Y10S 901/17* (2013.01)

(56) References Cited

U.S. PATENT DOCUMENTS

| | | | | |
|---|---|---|---|---|
| 5,184,601 | A * | 2/1993 | Putman | B25J 9/042 901/17 |
| 5,351,676 | A * | 10/1994 | Putman | B25J 9/042 200/5 R |
| 5,441,042 | A * | 8/1995 | Putman | B25J 9/042 600/102 |
| 6,723,106 | B1 * | 4/2004 | Charles | B25J 9/0072 606/130 |
| 2010/0290886 | A1 * | 11/2010 | Hashimoto | B25J 9/042 901/30 |
| 2016/0107317 | A1 * | 4/2016 | Hashimoto | B25J 9/042 414/744.2 |

FOREIGN PATENT DOCUMENTS

| | | |
|---|---|---|
| JP | 2012056033 A | 3/2012 |
| WO | 2009066573 A1 | 5/2009 |

* cited by examiner

INDUSTRIAL ROBOT WITH ELEVATING MECHANISM AND ARM-ELEVATING MECHANISM

CROSS REFERENCE TO RELATED APPLICATIONS

This is the U.S. national stage of application No. PCT/JP2014/070735, filed on Aug. 6, 2014. Priority under 35 U.S.C. §119(a) and 35 U.S.C. §365(b) is claimed from Japanese Applications Nos. 2013-247027, filed Nov. 29, 2013; and 2013-247028, filed Nov. 29, 2013; the disclosures of which are incorporated herein by reference. Priority is also claimed under 35 U.S.C. §119(e) to U.S. Provisional Patent Application No. 61/864,272, filed Aug. 9, 2013, the disclosure of which is incorporated herein by reference.

FIELD OF THE INVENTION

At least an embodiment of the present invention relates to an industrial robot which configures part of an EFEM (Equipment Front End Module) and transfers semiconductors between a FOUP (Front Open Unifier Pod) and a semiconductor wafer processing apparatus.

BACKGROUND

Conventionally known is an industrial robot which configures part of an EFEM and transfers semiconductor wafers between a FOUP (or multiple FOUPs) and a semiconductor wafer processing apparatus (Patent reference 1, for example). The industrial robot disclosed in Patent reference 1 is provided with two hands on which semiconductors are to be mounted, an arm, to which the two hands are rotatably joined to the front end thereof, and a main body portion, to which the base end of the arm is rotatably joined. The arm is composed of a first arm, of which the base end is rotatably joined to the main body portion, a second arm, of which the base end is rotatably joined to the front end of the first arm, and a third arm, of which the base end is rotatably joined to the front end of the second arm and to which the hands are rotatably joined to the front end thereof. An arm-elevating mechanism is stored inside the main body portion to raise and lower the first arm.

PATENT REFERENCE

[Patent reference 1] Unexamined Japanese Patent Application 2011-230256 Publication A FOUP is manufactured based on the standard of a SEMI (Semiconductor Equipment and Materials Institute) where the height of a FOUP has a fixed dimension. On the other hand, there is no specific standard regarding a semiconductor wafer processing apparatus, and therefore the height of the semiconductor processor is randomly set. For this reason, the elevation by the arm-elevating mechanism becomes insufficient depending on the specification of the semiconductor wafer processing apparatus, and therefore, the industrial robot disclosed Patent reference 1 may not be used in an EFEM as it is.

In such a case, the configuration of the arm-elevating mechanism arranged inside the main body portion may be modified to increase the elevation by the arm-elevating mechanism. However, in order to increase the elevation by the arm-elevating mechanism, multiple kinds of industrial robots having the different mount of elevation by the arm-elevating mechanism need to be manufactured according to the height of the semiconductor wafer processing apparatus; therefore, the cost of industrial robot may increase.

On the other hand, if the elevation by the arm-elevating mechanism arranged inside the main body portion is insufficient, this problem may be solved by setting up an elevating mechanism, which raises and lowers the industrial robot itself of Patent reference 1, outside the industrial robot. However, when providing the elevating mechanism outside the industrial robot, the size of an EFEM may be increased.

SUMMARY

Therefore, at least an embodiment of the present invention provides an industrial robot, which transfers semiconductor wafers between multiple FOUPs arranged in a fixed direction and a semiconductor wafer processing apparatus and which configures part of an EFEM, capable of reducing the size of the EFEM in the direction orthogonal to the direction of the arrangement of multiple FOUPs and in the up-down direction even if the elevating mechanism for raising and lowering the robot main body is arranged outside the robot main body.

Also, when the elevation by the arm-elevating mechanism arranged inside the main body portion is insufficient, the aforementioned problem can be solved if the elevating mechanism for raising and lowering the industrial robot main body itself, disclosed in Patent reference 1, is provided outside the industrial robot. In this case, if a drive unit and a guide portion of the elevating mechanism is stored inside the EFEM to guide the industrial robot in the up-down direction, particles generated at the drive unit or the guide portion can be kept from coming into the inside of the EFEM. However, even when the drive unit or the guide portion of the elevating mechanism is stored inside the housing, particles generated at the drive unit or the guide portion may come into the EFEM through the joining portion between the industrial robot and the elevating mechanism, and cleanliness will not be maintained inside of the EFEM.

Therefore, at least an embodiment of the present invention provides an industrial robot, which configures part of the EFEM, capable of effectively preventing particles generated at a drive portion or a guide portion of the elevating mechanism from coming into the EFEM through the joining portion between the robot main body and the elevating mechanism even when the elevating mechanism for raising and lowering the robot main body is arranged outside the robot main body.

To achieve the above, the industrial robot of at least an embodiment of the present invention is featured by the fact that an industrial robot, which transfers semiconductor wafers between multiple FOUPs arranged in a fixed direction and a semiconductor wafer processing apparatus and which configures part of the EFEM, is provided with a robot main body and an elevating mechanism which is arranged outside the robot main body and raises and lowers the robot main body, wherein the robot main body is provided with a hand, on which semiconductor wafers are to be mounted, an arm which is configured by multiple arm portions joined together relatively rotatable to one another and to which the hand is rotatably joined to the front end thereof, and an arm-elevating mechanism for raising and lowering the arm; when the direction of the arrangement of the multiple FOUPs is the first direction, the direction orthogonal to the up-down direction and the first direction is the second direction, one side of the second direction is the third direction and the other side of the second direction is the fourth direction, the center of rotation of the base end of the arm relative to the main body portion is positioned farther toward the third direction side than the center of the main body portion when viewed in the top-bottom direction; in the stand-by state of the industrial robot where the arm is retracted and the multiple arm portions and the hand overlap in the top-bottom direction, part of the arm is positioned farther toward the fourth direction side than the main body portion; the main body portion is secured to the elevating mechanism; the elevating mechanism is located on either one side or both sides of the first direction and/or on the fourth direction side of the main body portion.

In the industrial robot of at least an embodiment of the present invention, in the stand-by state of the industrial robot where the arm is retracted and the multiple arm portions and the hand overlap in the up-down direction, part of the arm is positioned farther toward the fourth direction side than the main body portion of the robot main body. In this invention, the main body portion of the robot main body is secured to the elevating mechanism which raises and lowers the robot main body, and also the elevating mechanism is positioned on either one side or both sides of the first direction and/or on the fourth direction side of the main body portion. For this reason, in at least an embodiment of the present invention, the industrial robot can be arranged inside the housing the EFEM while the side face of the industrial robot in the third direction is brought closer to the side face of the housing the EFEM in the third direction. Therefore, according to at least an embodiment of the present invention, even if the elevating mechanism for raising and lowering the robot main body is positioned outside the robot main body, the size of the EFEM can be reduced in the second direction which is orthogonal to the direction of the arrangement of the multiple FOUPs (the first direction) and the up-down direction.

In at least an embodiment of the present invention, it is preferred that the arm be provided with the first arm portion, of which the base end is rotatably joined to the main body portion, and the elevating mechanism be arranged within the rotation area of the first arm portion with respect to the main body portion when viewed in the top-bottom direction. With this configuration, the width of the housing of the EFEM in the second direction can be set based on the radius of rotation of the first arm portion with respect to the main body portion regardless of the size of the elevating mechanism. Therefore, the size of the EFEM can further be reduced in the second direction.

In at least an embodiment of the present invention, it is preferred that the main body portion be formed such that the shape thereof when viewed in the up-down direction is a rectangular or square shape which has side faces parallel to the first direction. With this configuration, the industrial robot can be arranged inside the housing of the EFEM while the side face of the industrial robot on the third direction side is brought closer to the side face of the housing of the EFEM on the third direction side. Therefore, the size of the EFEM can be further reduced in the second direction.

In at least an embodiment of the present invention, it is preferred that the side face of the main body portion on the fourth direction side be attached to the elevating mechanism. With this configuration, the size of the industrial robot can be reduced in the first direction.

Next, to achieve the above, the industrial robot of at least an embodiment of the present invention is featured by the fact that an industrial robot, which configures part of an EFEM and transfers semiconductor wafers between FOUP and a semiconductor wafer processing apparatus, is provided with a robot main body and an elevating mechanism which is positioned outside the robot main body and elevates the robot main body; the robot main body is provided with a hand on which semiconductor wafers are mounted, an arm to which the hand is rotatably joined to the front end thereof, a main body portion to which the base end of the arm is rotatably joined, and an arm-elevating mechanism for raising and lowering the arm; the elevating mechanism is provided with a drive unit for driving the robot main body in the up-down direction, a guide rail for guiding the robot main body in the up-down direction, a guide block which engages with the guide rail and slide in the up-down direction, a housing in which the drive unit, the guide rail and the guide block are housed, and a joining member for joining the robot main body positioned outside the housing and the guide block; the housing is provided with a flat sheet-like cover positioned between the guide block and the main body portion; a slit-like through-hole elongated in the up-down direction is formed in the cover so that the joining member can move in the up-down direction; formed in the joining member is a through-hole passing portion which is to be positioned in the through-hole; and the width of the through-hole passing portion in the width direction of the through-hole orthogonal to the thickness direction of the cover and the up-down direction and the width of the through-hole are narrower than the width of the guide block in the width direction of the through-hole.

In the industrial robot of at least an embodiment of the present invention, the drive unit, the guide rail and the guide block which configure part of the elevating mechanism are housed in the housing. Also, in at least an embodiment of the present invention, the flat-sheet like cover which configures part of the housing is positioned between the guide block and the main body portion of the robot main body; in this cover, the slit-like through-hole elongated in the up-down direction is formed. Further, in at least an embodiment of the present invention, the through-hole passing portion to be positioned in the through-hole is formed in the joining member which joins the robot main body with the guide block, and the width of the through-hole passing portion in the through-hole width direction and the width of the through-hole are narrower than the width of the guide block in the width direction of the through-hole. For this reason, the width of the through-hole can be narrow in at least an embodiment of the present invention, compared to the configuration where the guide block is arranged in the through-hole of the cover. Therefore, according to at least an embodiment of the present invention, even when the elevating mechanism for raising and lowering the robot main body is positioned outside the robot main body, particles generated at the drive unit or the guide portion of the elevating mechanism can effectively be prevented from coming from the joint section between the robot main body and the elevating mechanism into the EFEM.

In at least an embodiment of the present invention, it is preferred that the main body portion be formed such that the shape thereof is rectangle or square when viewed in the up-down direction; the elevating mechanism be provided with a fixing member which is positioned outside the housing and to which one of the side faces of the main body portion is secured; and the fixing member be secured to the front end of the through-hole passing portion. In this configuration, the robot main body and the elevating mechanism can be joined by using the side face of the robot main body, which is formed flat, and the fixing member positioned outside the housing; therefore, the robot main body and the elevating mechanism can easily be joined.

In at least an embodiment of the present invention, it is preferred that the elevating mechanism be provided with an exhaust fan which is attached to the housing to discharge the air inside the housing to the outside of the EFEM. In this configuration, particles generated at the drive unit or the guide portion of the elevating mechanism can more effectively be prevented from coming out of the joint section between the robot main body and the elevating mechanism into the EFEM.

In at least an embodiment of the present invention, for example, the elevating mechanism is provided with two guide rails, which are spaced at a predetermined gap in the width direction of the through-hole and two joining members, which are secured to the guide block which engages with each of the two guide rails, and a connecting member which is arranged inside the housing to connect the two joining members; the drive unit is connected to one of the two joining members.

As described above, to achieve the above, in the industrial robot which transfers semiconductor wafers between multiple FOUPs arranged in a fixed direction and a semiconductor wafer processing apparatus and which configures part of the EFEM, the elevating mechanism for raising and lowering the robot main body is positioned outside the robot main body, the size of the EFEM can be reduced in the direction which is orthogonal to the direction of the arrangement of the multiple FOUPs and orthogonal to the up-down direction.

As described above, to achieve the above, in the industrial robot configuring part of the EFEM, even if the elevating mechanism for raising and lowering the robot main body is positioned outside the robot main body, particles generated at the drive unit or the guide portion of the elevating mechanism can effectively be prevented from coming out of the joining portion between the robot main body and the elevating mechanism into the EFEM.

BRIEF DESCRIPTION OF DRAWING

Embodiments will now be described, by way of example only, with reference to the accompanying drawings which are meant to be exemplary, not limiting, and wherein like elements are numbered alike in several Figures, in which.

DETAILED DESCRIPTION

Figure 1:
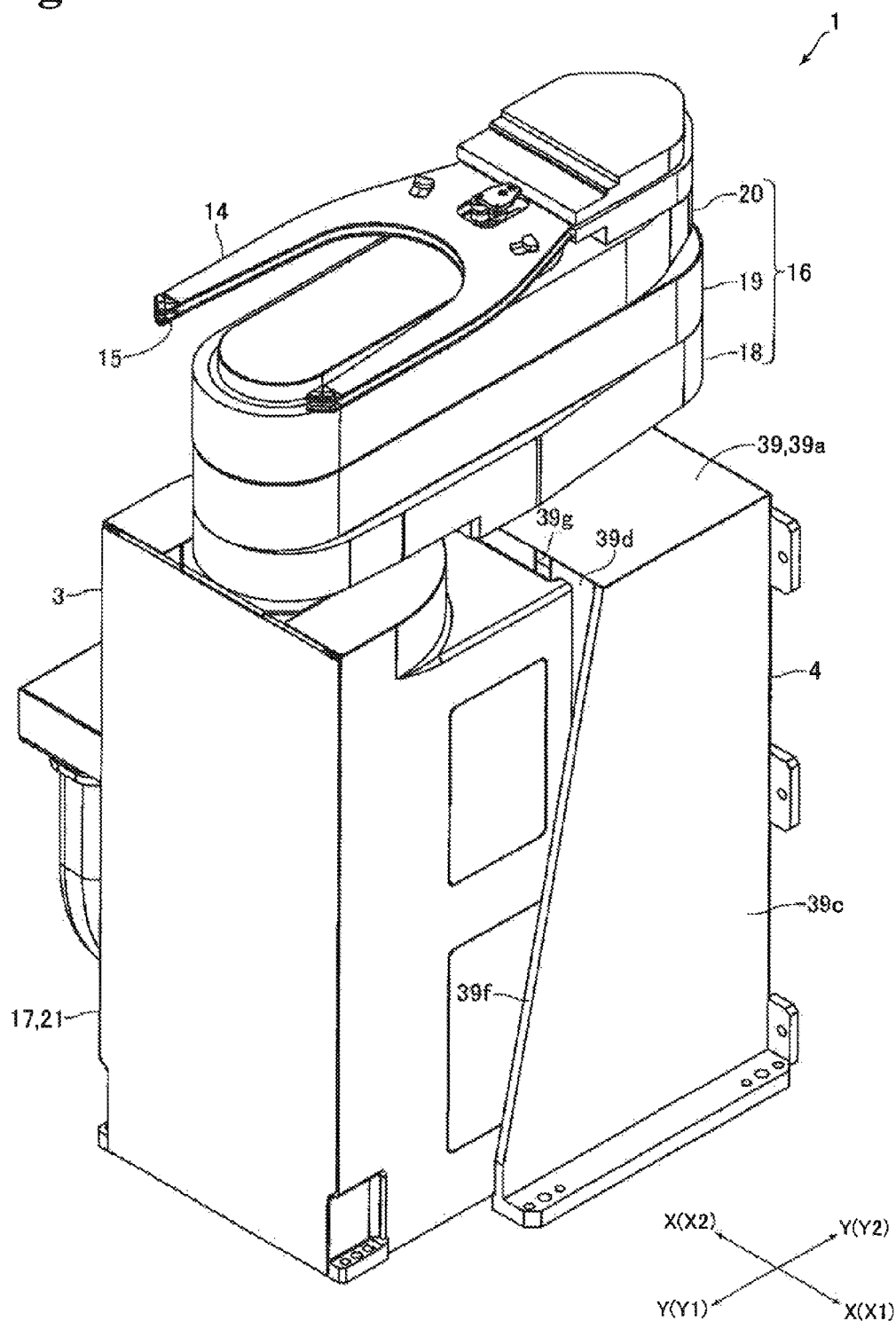
FIG. 1 is a perspective view of an industrial robot of an embodiment of the present invention.

Embodiments of the present invention are described hereinafter referring to the drawings.
(Configuration of Industrial Robot)

Figure 2:
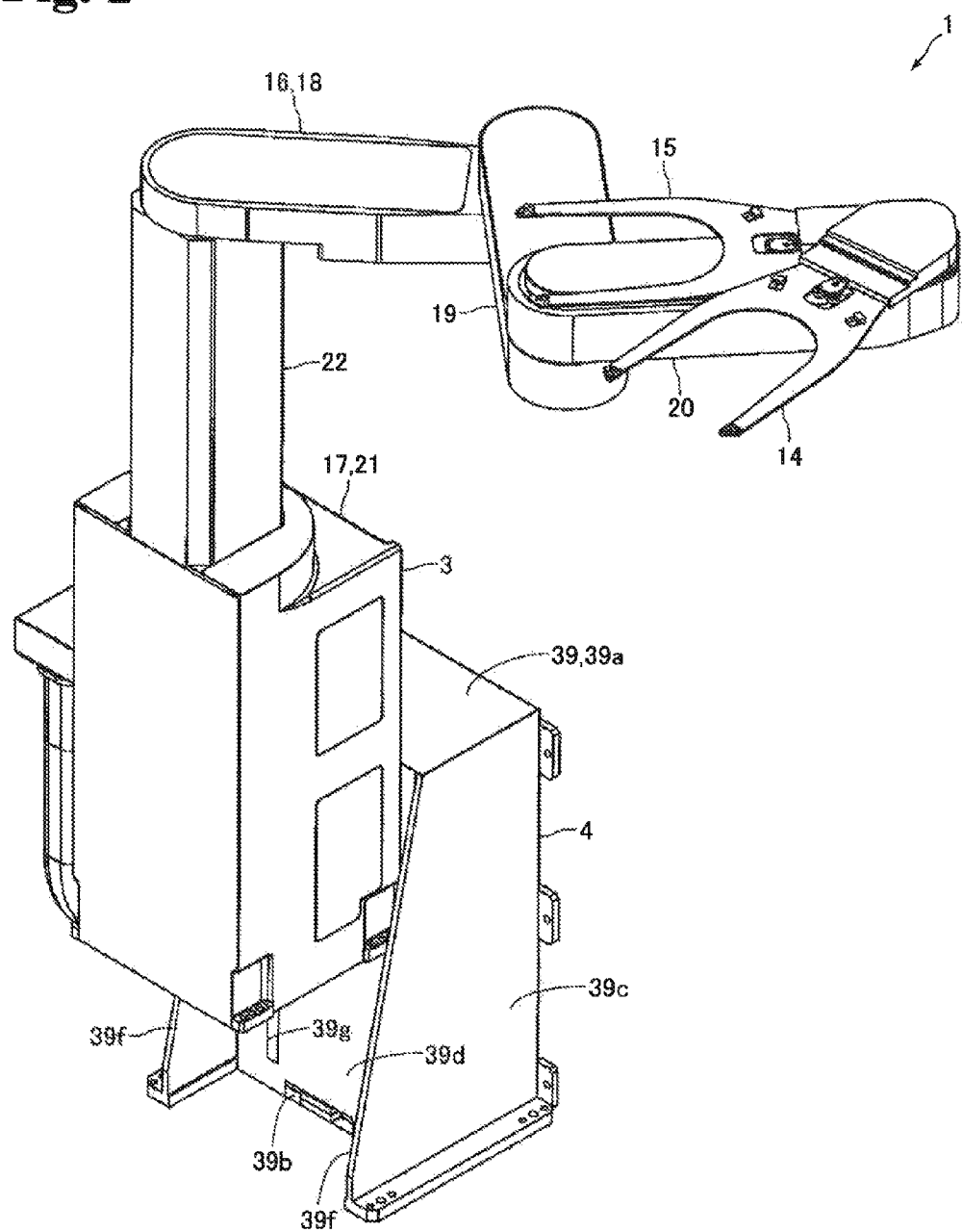
FIG. 2 is a perspective view of the industrial robot of FIG. 1, showing the robot main body and the arm elevated and also the arm extended.
Figure 2:
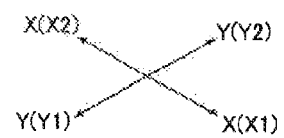
Figure 3:
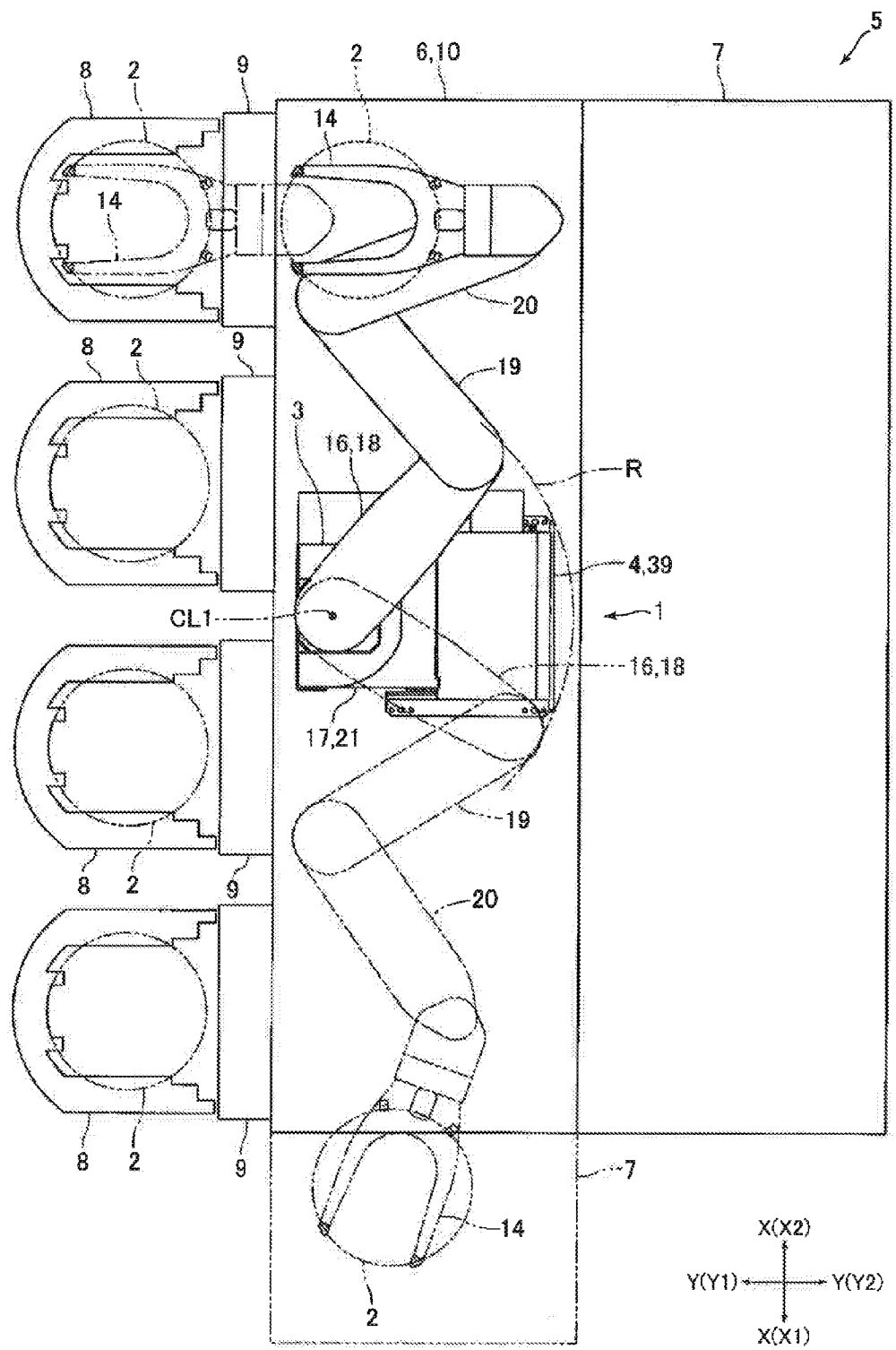
FIG. 3 is a plan view of a semiconductor manufacturing system in which the industrial robot of FIG. 1 is used.

FIG. 1 is a perspective view of an industrial robot 1 of an embodiment of the present invention. FIG. 2 is a perspective view of the industrial robot 1 of FIG. 1, with a robot main body 3 and an arm 16 elevated and the arm 16 extended. FIG. 3 is a plan view of a semiconductor manufacturing system 5 in which the industrial robot 1 of FIG. 1 is used.

The industrial robot 1 of this embodiment is a horizontal articulated robot for transferring semiconductor wafers (see FIG. 3). This industrial robot 1 is configured by a robot main boy 3 and an elevating mechanism 4 which raises and lowers the robot main body 3. In the description below, the industrial robot 1 is denoted as "robot 1" and the semiconductor wafer 2 "the wafer 2". Also, in the following description, the X direction in FIG. 1, etc. orthogonal to the up-down direction is "the left-right direction"; the Y direction orthogonal to the up-down direction and the left-right direction is "the front-rear direction"; the X1 direction side is "the right" side; the X2 direction side is the "left side"; the Y direction side is the "front" side; and the Y2 direction side is the "rear" side.

As shown in FIG. 3, the robot 1 is installed and used in the semiconductor manufacturing system 5. The semiconductor manufacturing system 5 is provided with a semiconductor wafer processing apparatus 7 which performs predetermined processes on wafers 2. The EFEM 6 is positioned on the front side of the semiconductor wafer processing apparatus 7. The robot 1 configures part of the EFEM 6. Also, the EFEM 6 is provided with multiple load ports 9 that open/close the FOUPs 8 and a housing 10 in which the robot 1 is housed. The housing 10 is formed in a rectangular parallelepiped box-shape elongated in the left-right direction. The front face and the rear face of the housing 10 is parallel to the plane created by the up-down direction and the left-right direction. Inside the housing 10 is a clean space. In other words, inside the EFEM 6 is a clean space in which a predetermined cleanliness is maintained.

The FOUP 8 is manufactured based on the SEMI standard; the FOUP 8 can store 25 or 13 individual wafers 2. The load ports 9 are positioned on the front side of the housing 10. The EFEM 6 of this embodiment is provided with four load ports 9 spaced at a predetermined pitch in the left-right direction; in the EFEM 6, four FOUPs 8 are arranged at a predetermined pitch in the left-right direction. The robot 1 transfers wafers 2 between the four FOUPs and the semiconductor wafer processing apparatus 7. In the first embodiment, the left-right direction which is the direction of arrangement of the four FOUPs is defined as the first direction; the front-rear direction is defined as the second direction which intersects orthogonally with the left-right direction that is the first direction and with the up-down direction; the front direction (Y1 direction) which is on one side of the second direction is defined as the third direction; and the rear direction (Y2 direction) which is on the other side of the second direction is defined as the fourth direction.
(Configuration of Robot Main Body)

Figure 4:
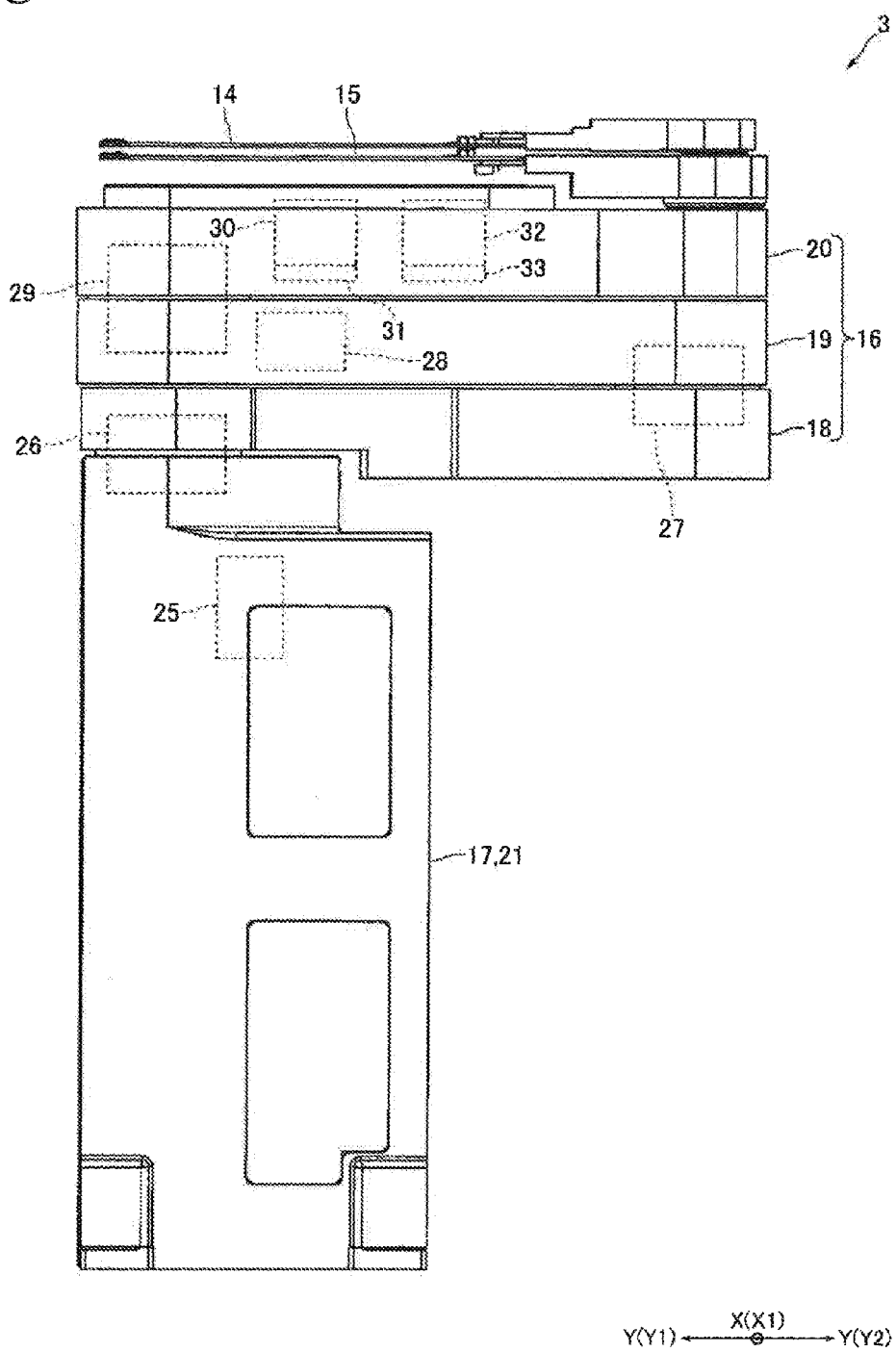
FIG. 4 is a side view of the robot main body of FIG. 1.

FIG. 4 is a side view of the robot main body 3 shown in FIG. 1.

The robot main body 3 is provided with two hands 14, 15, on which wafers 2 are to be mounted, an arm 16 to which the hands 14, 15 are rotatably joined to the front end thereof, and a main body portion 17, to which the base end of the arm 16 is rotatably joined. The arm 16 is configured by a first arm portion 18, of which the base end is rotatably joined to the main body portion 17, a second arm portion 19, of which the base end is rotatably joined to the front end of the first arm portion 18, and a third arm portion 20, of which the base end is rotatably joined to the front end of the second arm portion 19. In other words, the arm 16 has three arm portions which are rotatably joined to each other. The first arm portion 18, the second arm portion 19 and the third arm portion are all formed hollow. Also, in this embodiment, the length of the first arm portion 18, the length of the second arm portion 19 and the length of the third arm portion are all equal to each other. The main body portion 17, the first arm portion 18, the second arm portion 19 and the third arm portion 20 are arranged in this order from the bottom in the up-down direction.

The hands 14, 15 are formed such that the shape thereof is a Y-shape when viewed in the up-down direction; the wafers 2 are to be mounted on the front end side of the forked hand 14, 15. The base ends of the hands 14, 15 are rotataby joined to the front end of the third arm portion 20. The hands 14, 15 are arranged to overlap in the up-down direction. More specifically, the hand 14 is positioned at the top and the hand 15 is positioned at the bottom. Also, the hands 14, 15 are positioned above the third arm portion 20.

Note that the illustration of the hand 15 is omitted in FIG. 3. When the robot 1 is in operation, the hand 14 and the hand 15 sometimes overlap with each other in the up-down direction; however, most of the time, the hand 14 and the hand 15 do not overlap with each other in the up-down direction. For example, as shown by long dashed double short dashed lines in FIG. 3, when the hand 14 is placed in the FOUP 8, the hand 15 is rotated toward the main body portion 17 so that it is not in in the FOUP 8. The angle of rotation of the hand 15 with respect to the hand 14 at that time is between 120° and 150°, for example.

The main body portion 17 is provided with a housing 21 and a column member 22 (see FIG. 2) to which the base end of the first arm portion 18 is rotatably joined. The housing 21 is formed in a rectangular parallelepiped shape elongated in the up-down direction, and the shape of the housing 21 when viewed in the up-down direction is rectangular or square. The front face and the rear face of the housing 21 is parallel to the plane created by the up-down direction and the left-right direction; the side faces of the housing 21 on left and right are parallel to the plane created by the up-down direction and the front-rear direction. In other words, the main body portion 17 is formed in a rectangular parallelepiped shape elongated in the up-down direction, having a rectangular or a square shape when viewed in the up-down direction. Also, the front face and the rear face are parallel to the plane created by the up-down direction and the left-right direction; the side faces of the main body portion 17 on left and right are parallel to the plane created by the up-down direction and the front-rear direction.

The column member 22 is formed to be a long and narrow column elongated in the up-down direction. Inside the housing 21, an arm-elevating mechanism (no illustration) for raising and lowering the column member 22 is housed. In other words, inside the housing 21, the arm-elevating mechanism for raising and lowering the first arm portion 18 (that is, for raising and lowering the arm 16) relative to the main body portion 17 is housed. The arm-elevating mechanism is configured by a ball screw arranged having the up-down direction as its axial direction, a nut member which engages with the ball screw, and a motor, etc. for rotating the ball screw. As shown in FIG. 1, the arm-elevating mechanism raise and lowers the column member 22 between the position at which the column member 22 is housed in the housing 21 and the position at which the column member 22 projects upwardly from the housing 21, as shown in FIG. 2. In other words, the arm-elevating mechanism raises and lower the arm 16 between the position at which the column member 22 is housed in the housing 21 and the position at which the column member 22 projects upwardly from the housing 21.

The column member 22 is arranged on the front side of the housing 21. The base end of the first arm portion 18 is rotatably joined to the top end of the column member 22. In other words, as shown in FIG. 3, the center of rotation C1 of the first arm portion 18 (that is, the center of rotation of the arm 16 on the base end side) with respect to the main body portion 17 is positioned farther toward the front side (toward the FOUPs 8) than the center of the main body portion 17, when viewed in the up-down direction. The column member 22 is arranged in the center position of the housing 21 in the left-right direction.

In FIG. 1 and FIG. 4, the robot 1 is at a standby state where the arm 16 is retracted and the first arm portion 18, the second arm portion 19, the third arm portion 20 and the hands 14, 15 overlap with each other in the up-down direction. In the standby state, part of the arm 16 and the hands 14 and 15 project toward the back farther than the main body portion 17.

The robot main body 3 is provided with an arm portion-driving mechanism for rotating the first arm portion 18 and the second arm portion 19 and extending and retracting part of the arm 16 configured by the first arm portion 18 and the second arm portion 19, a third arm driving mechanism for rotating the third arm portion 20, a first hand-driving mechanism for rotating the hand 14, and a second hand-driving mechanism for rotating the hand 15.

As shown in FIG. 4, the arm portion-driving mechanism is provided with a motor 25 which is a driving source, a reduction gear 26 for reducing the power of the motor 25 and transmitting the result to the first arm portion 18, and a reduction gear 27 for reducing the power of the motor 25 and transmitting the result to the second arm portion 19. The motor 25 is arranged inside the housing 21. The reduction gear 26 configures a joint section that joins the main body portion 17 and the first arm portion 18. The reduction gear 27 configures a joint section that joins the first arm portion 18 and the second arm portion 19. The reduction gear 26, 27 is a harmonic drive (registered trade mark) which is a wave gear device, for example. In the same manner as the industrial robot disclosed in the above-described Patent reference 1, the motor 25 and the reduction gear 26 are connected with each other via a pulley and a belt whose illustrations are omitted in the figure, and the motor 25 and the reduction gear 27 are connected with each other via a pulley and a belt whose illustrations are omitted in the figure.

The third arm portion-driving mechanism, as shown in FIG. 4, is provided with a motor 28 which is a driving source and a reduction gear 29 for reducing the power of the motor 28 and transmitting the result to the third arm portion 20. The motor 28 is arranged on the front side inside the second arm portion 19. The reduction gear 29 configures a joint section that connects the second arm portion 19 and the third arm portion 20. The reduction gear 29 is a harmonic drive (registered trade mark), for example. The motor 28 and the reduction gear 29 are connected with each other via a gear train whose illustration is omitted in the figure.

The first hand-driving mechanism is, as shown in FIG. 4, provided with a motor 30 which is a driving source, a reduction gear 31 for reducing the power of the motor 30 and transmitting the result to the hand 14. In the same manner as the first hand-driving mechanism, the second hand-driving mechanism is provided with a motor 32 which is a driving source and a reduction gear 33 for reducing the power of the motor 32 and transmitting the result to the hand 15. The motors 30, 32 and the reduction gears 31, 33 are arranged inside the third arm portion 20. The reduction gear 31, 33 is a harmonic drive (registered trade mark), for example. In the same manner as the industrial robot disclosed in the above-described Patent reference 1, the reduction gear 31 is attached to the output shaft of the motor 30, and the reduction gear 33 is attached to the output shaft of the motor 32. Also, the hand 14 and the reduction gear 31 are connected to each other via a pulley and a belt whose illustrations are omitted in the figure, and the hand 15 and the reduction gear 33 are connected to each other via a pulley and a belt whose illustrations are omitted in the figure.

The robot main body 3 of this embodiment is capable of taking the wafers in an out of the FOUPs 8 even by itself. In other words, even without the elevating mechanism 4 attached, the robot main body 3 is capable of taking the wafers 2 in and out of the FOUPs 8 by elevating the column member 22, rotating the first arm portion 18, the second arm portion 19 and the third arm portion 20 to extend/retract the arm 16, and rotating the hands 14 and 15.

(Configuration of Elevating Mechanism)

Figure 5:
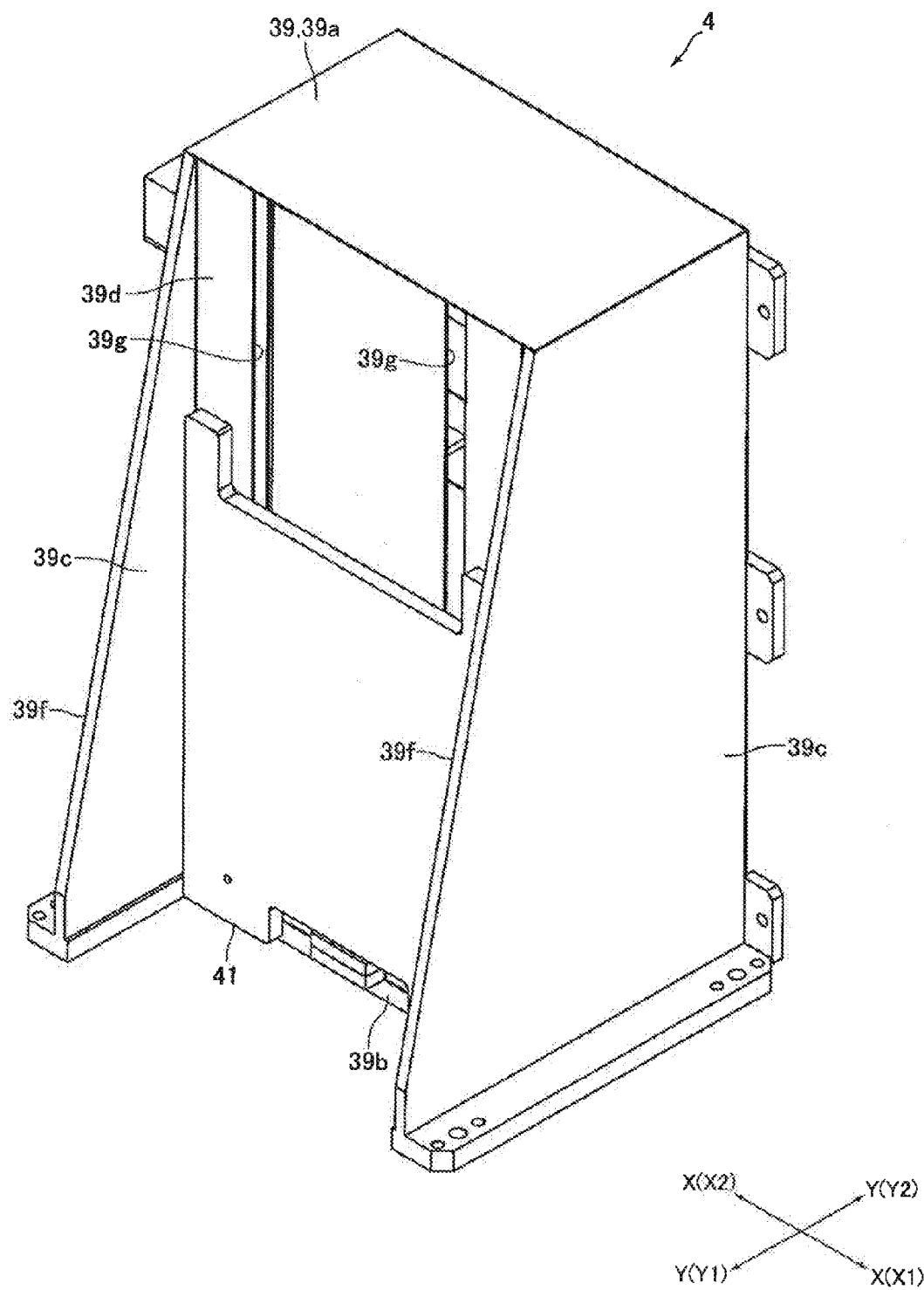
FIG. 5 is a perspective view of an elevating mechanism shown in FIG. 1.
Figure 6:
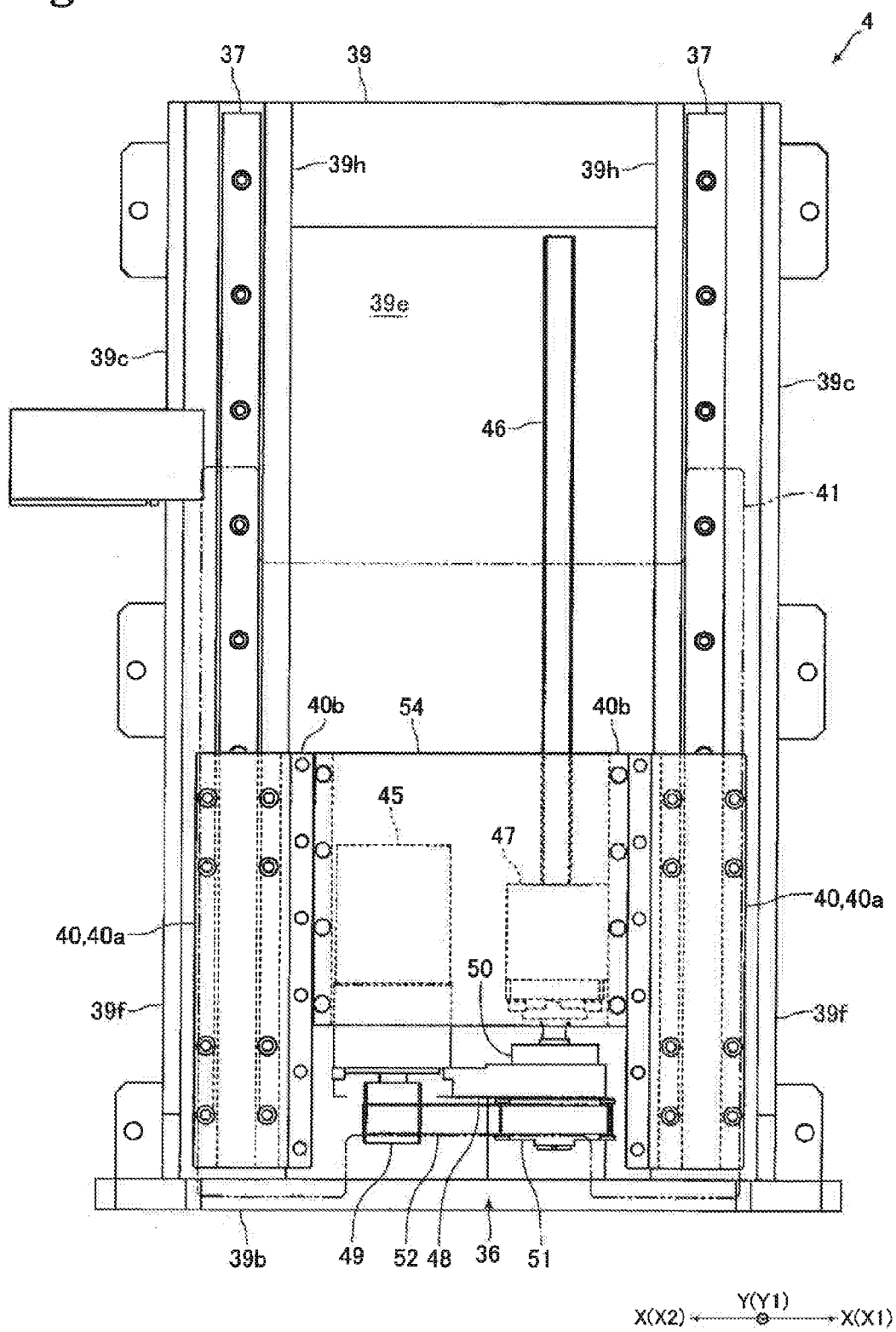
FIG. 6 is a diagram to explain the configuration of the elevating mechanism of FIG. 5 from the front side.
Figure 7:
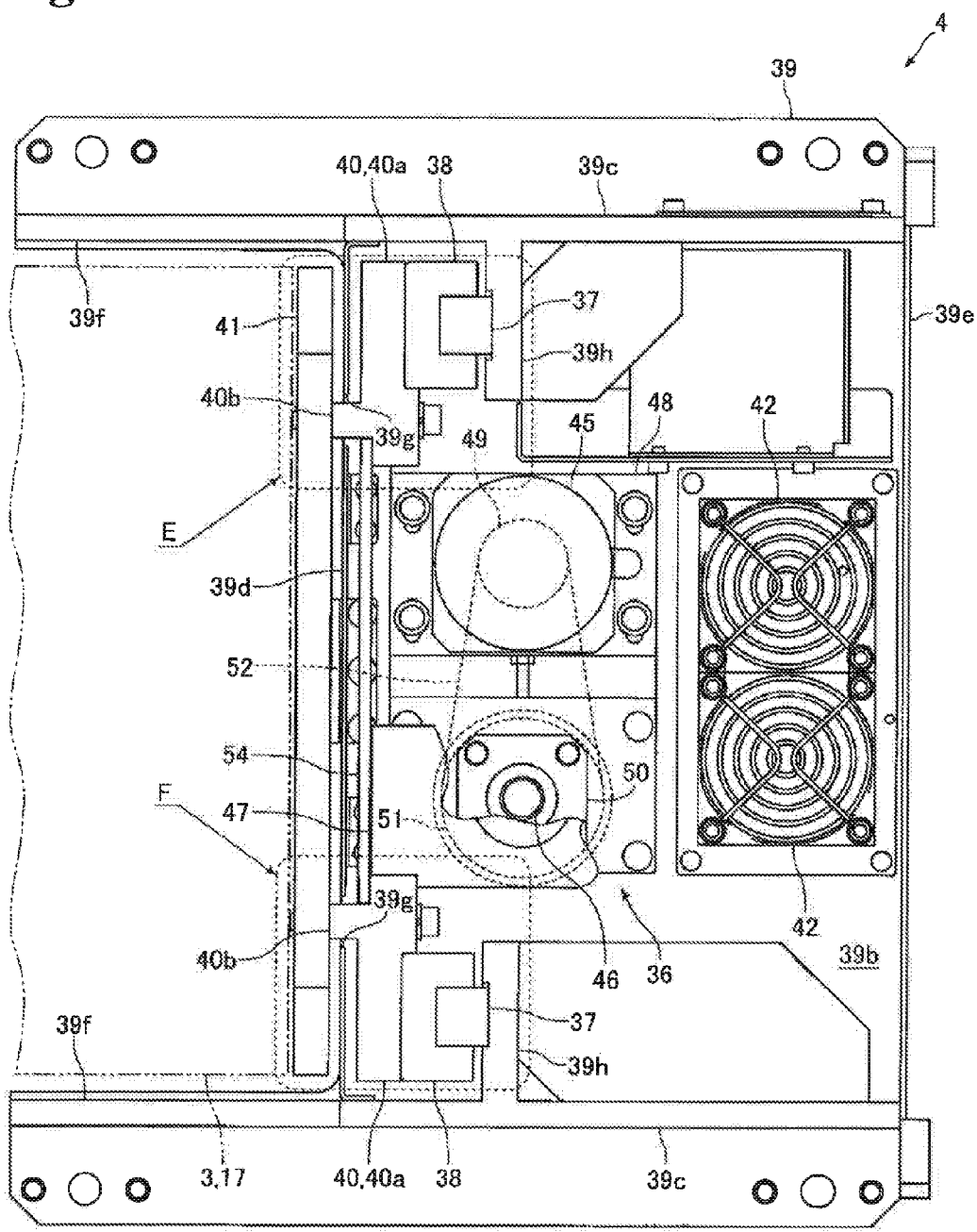
FIG. 7 is a diagram to explain the configuration of the elevating mechanism of FIG. 5 from the top side.
Figure 7:
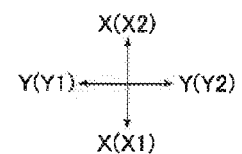
Figure 8A:
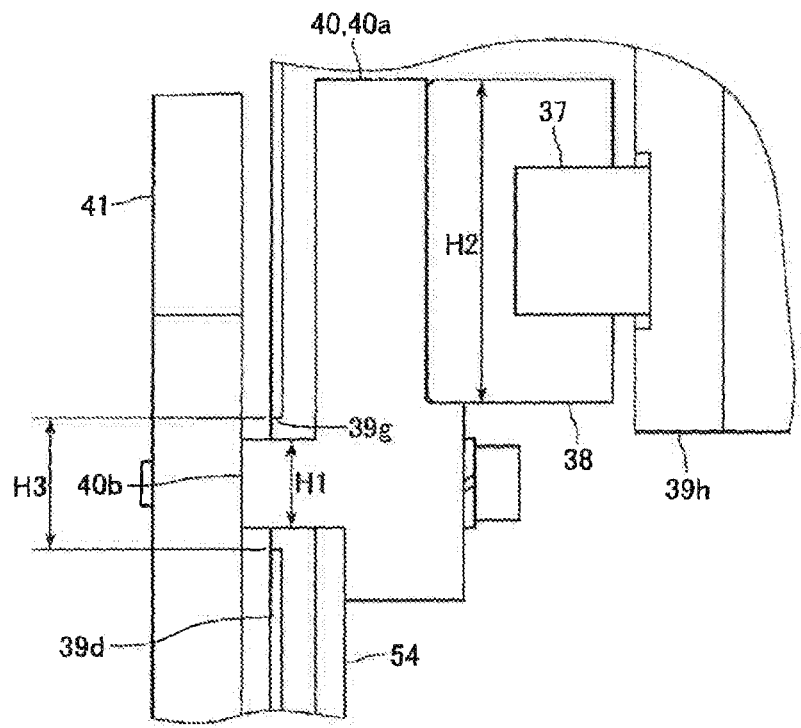
FIG. 8(A) is an enlarged view of the E section of FIG. 7.
Figure 8B:
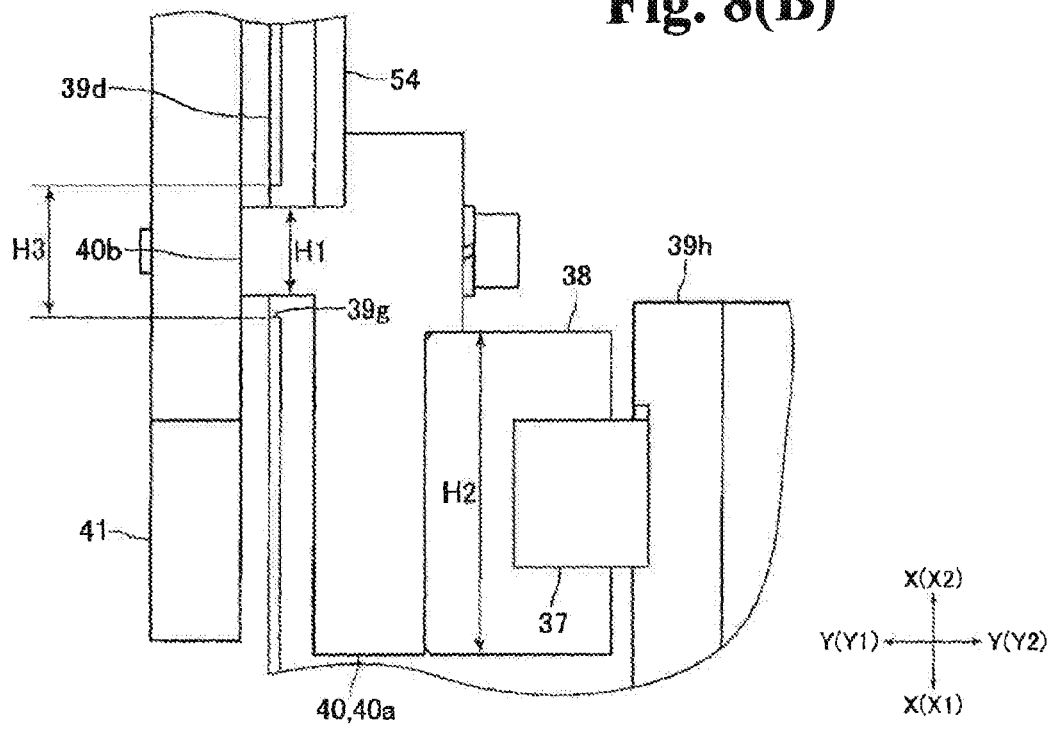
FIG. 8(B) is an enlarged view of the F section of FIG. 7.

FIG. 5 is a perspective view of the elevating mechanism 4 shown in FIG. 1. FIG. 6 is a diagram to explain the configuration of the elevating mechanism 4 of FIG. 5 from the front side. FIG. 7 is a diagram to explain the configuration of the elevating mechanism 4 of FIG. 5 from the top side. FIG. 8 (A) is an enlarged view of the E section of FIG. 7; FIG. 8 9B) is an enlarged view of the F section of FIG. 7.

The elevating mechanism 4 is formed as a separate body from the robot main body 3 and positioned outside the robot main body 3. Also, the elevating mechanism 4 is secured to the bottom face of the housing 10. The elevating mechanism 4 is provided with a drive unit 36 for driving the robot main body 3 in the up-down direction, two guide rails 37 for guiding the robot main body 3 in the up-down direction, a guide block 38 which engages with the two guide rails 37 and slides in the up-down direction, a housing 39 in which the drive unit 36, the guide rails 37 and the guide block 38 are housed, two joining member 40 for connecting the robot main body 3, which is positioned outside the housing 39, and the guide block 38, a fixing member 41 which is arranged outside the housing 39 and on which the robot main body 3 is secured, and two exhaust fans 42 (see FIG. 7) for discharging the air inside the housing 39 to the outside of the EFEM 6 (in other words, outside the housing 10).

The housing 39 is formed in a rectangular parallelepiped shape elongated in the up-down direction as a whole. The housing 39 is configured by a top face portion 39a that configures the top face of the housing 39, a bottom face portion 39b that configures the bottom face of the housing 39, side face portions 39c that configure the side faces of the housing 39 on left and right, a front face portion 39d that configures the front face of the housing 39, and a rear face portion 39e that configures the back face of the housing 39.

The top face portion 39a and the bottom face portion 39b are formed to be like a rectangular flat-sheet having the up-down direction as its thickness direction. The front face portion 39d and the rear face portion 39e are formed to be like a rectangular flat sheet having the front-rear direction as its thickness direction and having the up-down direction as its longitudinal direction. The side face portions 39c are respectively formed in a trapezoidal flat sheet having the left-right direction as its thickness direction. The top edge face and the bottom edge face of each of the side face portions 39c orthogonally intersect with the up-down direction, and the rear edge face of the side face portion 39c orthogonally intersects with the front-rear direction. The front edge face of the side face portion 39c is a tapered surface that fans out toward the front as toward the bottom.

The bottom surface of the top face portion 39a abuts on the top edge surface of the side face portion 39c, and the front surface of the rear face portion 39e abuts on the rear edge surface of the side face portions 39c. The outer surface of the bottom face portion 39b on left and right abuts on the bottom edge of the inner surface of the side face portion 9c on left and right. The bottom surface of the top face portion 39a abuts on the top edge surface of the front face portion 39d, and the top surface of the bottom face portion 39b abuts on the bottom edge surface of the front face portion 39d. The front edge surface of the top face portion 39a, the front edge surface of the bottom face portion 39b and the front surface of the front face portion 39d are aligned with each other. The inner surfaces of the side face portions 39c in the left-right direction abut on the side edge surfaces of the front face portions 39d on left and right. The front edge side of the side face portion 39c is a protrusion portion 39f that projects further to the front than the front face portion 39d.

A slit-like through-hole 39g elongated in the up-down direction is formed in the front face portion 39d. The through-hole 39g is formed over the entire area of the front face portion 39d in the up-down direction so that the joining member 40 can move in the up-down direction. Also, two through-holes 39g are formed in the front face portion 39d having a predetermined gap between them in the left-right direction. In the second embodiment, the left-right direction is the width direction of the through-hole 39g.

The drive unit 36 is provided with a motor 45, which is a driving source, a ball screw 46 that is rotated by the power of the motor 45, and a nut member 47 that engages with the thread of the ball screw 46. The motor 45 is secured to a holding member 48 that is fixed to the top surface of the bottom face portion 39b and arranged at the bottom in the housing 39. The motor 45 is also secured to the holding member 48 such that the output shaft thereof protrudes downwardly. A pulley 49 is fixed to the output shaft of the motor 45. The ball screw 46 is arranged having the up-down direction as its axial direction. The bottom end of the ball screw 46 is rotatably supported by a bearing 50 which is arranged at the bottom in the housing 39. The bearing 50 is attached to the holding member 48. A pulley 51 is fixed to the bottom end of the ball crew 46. A belt 52 is bridged over the pulley 49 and the pulley 51. The nut member 47 is secured to one of the two joining members 40, as described later.

The guide rail 37 is secured to a rail mounting portion 39h that protrudes from the inner surface of the side face portion 39c in the left-right direction toward the inside in the left-right direction. In other words, the two guide rails 37 are arranged having a predetermined gap between them in the left-right direction. The drive unit 36 is arranged between the two guide rails 37 in the left-right direction. The guide rails 37 are secured to the rail mounting portions 39h having the up-down direction as their longitudinal direction. Also, the guide rails 37 are secured to the front surface of the rail mounting portions 39h. The guide block 38 is engaged with the front surface of the guide rails 37.

The joining member 40 is formed in a rectangular parallelepiped block shape elongated in the up-down direction. The outer portion of the joining member 40 in the left-right direction is a block-secured portion 40a which is secured to the guide block 39. The block-secured portion 40a is secured to the front surface of the guide block 38. More specifically described, the block-secured portion 40a is secured to the front surface of the guide block 38 while the front surface of the guide block 38 and the rear surface of the block-secured portion 40a are made contact with each other. In other words, each of the two joining members 40 is secured to the guide block 38 that engages with each of the two guide rails 37.

The two joining members 40 are connected to each other by a flat-sheet like connecting member 54. The connecting member 54 is arranged inside the housing 39. Also, the left and right sides of the connecting member 54 are secured to the front surface of the inner portions of the joining member 40 in the left-right direction. A nut member 47 is secured to one of the two joining members 40. In this embodiment, the ball screw 46 and the nut member 47 are arranged on the right side of the motor 45, and the nut member 47 is secured to the left end surface of the joining member 40 positioned on the right side.

Formed inside portions of the joining member 40 in the left-right direction is a through-hole passing portion 40b which is arranged in the through-hole 39g so as to pass through the through-hole 39 in the front-rear direction. The through-hole passing portion 40b is formed to project from the block-secured portion 40a to the front side. Also, the through-hole passing portion 40b is formed over the entire area of the joining member 40 in the up-down direction and formed to be a rectangular parallelepiped elongated in the up-down direction. The leading edge (the front end) of the through-hole passing portion 40b projects farther toward the front than the front face portion 39d. In other words, most of the joining member 40 except the leading edge of the through-hole passing portion 40b is housed inside the housing 39. The leading edge surface (the front end surface) of the through-hole passing portion 40b is formed to be a flat surface which orthogonally intersects with the front-rear direction.

As shown in FIG. 8, the width H1 of the through-hole passing portion 40b in the left-right direction is narrower than the width H2 of the guide block 38 in the left-right direction. The width H3 of the through-hole 39g in the left-right direction is narrower than the width H2 of the guide block 38.

The fixed member 41 is formed to be like a flat sheet having the front-rear direction as its thickness direction. The fixed member 41 is arranged on the front side of the front face portion 39d. Also, the fixed member 41 is arranged between two protrusions 39f in the left-right direction. The fixed member 41 is secured to the leading edge surface of the through-hole passing portion 40b. More specifically described, the fixed member 41 is secured to the front end surface of the through-hole passing portion 40b while the front end surface of the through-hole passing portion 40b and the rear face of the fixed member 41 are made contact with each other.

The robot main body 3 is secured to the front surface of the fixed member 41. More specifically described, the rear surface of the housing 21, which is one of the side surfaces of the main body 17, is fixed to the front surface of the fixed member 41. In other words, the rear surface of the main body portion 17 is attached to the elevating mechanism 4, and the elevating mechanism 4 is arranged behind the main body portion 17. Also, a part of the rear surface of the main body portion 17 is positioned between the two protrusions 39f in the left-right direction. The front face portion 39d in the second embodiment functions as a cover positioned between the guide blocks 38 and the main body portion 17.

As shown in FIG. 3, the elevating mechanism 4 fits in the area of rotation of the first arm portion 18 with respect to the main body 17 when viewed in the up-down direction. In other words, the elevating mechanism 4 fists on the inner circumferential side of the trace R of the leading edge of the first arm portion 18 (more specifically, the arc trace) when the first arm portion 18 rotates around the center C1 of rotation of the first arm portion 18.

The exhaust fans 42 are attached to the top surface of the bottom face portion 39b of the housing 39. The exhaust fans 42 are also positioned behind the drive unit 36. The two exhaust fans 42 are arranged next to each other in the left-right direction. In the bottom face portion 39b, a through-hole is created for the air discharged from the two exhaust fans 42 to pass through. There is also a through-hole created in the portion in the bottom face portion of the housing 10, at which the elevating mechanism 4 is secured, for the air discharged by the exhaust fans 42 to pass through. With this configuration, the air inside the housing 39 is discharged to the outside of the EFEM 6 by the exhaust fans 42.

In this embodiment, the robot main body 3 is raised and lowered with respect to the housing 39 of the elevating mechanism 4 if necessary when wafers 2 are transferred between the FOUPs 8 and the semiconductor wafer processing apparatus 7.

(Major Effects of the First Embodiment)

As described above, in the first embodiment, in the standby state of the robot 1 where the arm 16 is retracted and first arm portion 18, the second arm portion 19, the third arm portion 20 and the hands 14, 15 are overlapped each other, part of the arm 16 and the hands 14 and 15 project fartherr toward the back than the main body portion 17. Also, in this embodiment, the main body portion 17 of the robot main body 3 is secured to the elevating mechanism 4, and the elevating mechanism 4 is arranged behind the main body portion 17. Therefore, in this embodiment, the robot 1 can be arranged inside the housing 10 while the front face of the robot 1 is made close to the front face of the housing 10 of the EFEM 6. Therefore, in this embodiment, even when the elevating mechanism 4 for raising and lowering the robot main body 3 is arranged outside the robot main body 3, the size of the EFEM 6 can be reduced in the front-rear direction.

In particular in the first embodiment, the main body unit 17 is formed such that the shape thereof is rectangular or square when viewed in the up-down direction and the front face of the main body unit 17 is parallel to the plane created by the up-down direction and the left-right direction; therefore, the robot 1 can be positioned inside the housing while the front face of the robot 1 is made closer to the front face of the housing 10 of the EFEM 6. Therefore, in this embodiment, the size of the EFEM 6 can be reduced in the front-rear direction.

In the first embodiment, the elevating mechanism 4 fits inside the inner circumference of the trace R of the leading edge of the first arm portion 18, as viewed in the up-down direction, when the first arm portion 18 is rotated around the center of rotation C1 of the first arm portion 18; therefore, the width of the housing 10 in the front-rear direction can be determined based on the radius of rotation of the first arm portion 18 with respect to the main body portion 17, without being affected by the size of the elevating mechanism 4. Therefore, in this embodiment, the size of the EFEM 6 can be further reduced in the front-rear direction.

Also, in the first embodiment, the elevating mechanism 4 is positioned behind the main body portion 17; therefore, the size of the robot 1 can be reduced in the left-right direction.

Major Effects of Second Embodiment

As described above, in the second embodiment, the drive unit 36, the guide rails 37, and the guide block 38 which configure the elevating mechanism 4 are housed in the housing 39. In this embodiment, the flat sheet-like front face portion 39*d* is arranged between the guide block 38 and the main body unit 17, and the slit-like through-hole 39*g* elongated in the up-down direction is created in the front face portion 39*d*. Further, in this embodiment, the through-hole passing portions 40*b* are formed in the joining member 40 provided to connect the robot main body 3 and the guide block 38, and the width H1 of the through-hole passing portion 40*b* and the with H3 of the through-hole 39*g* in the left-right direction are narrower than the width H2 of the guide block 38 in the left-right direction. Therefore, in this embodiment, the width of the through-hole 39*g* can be kept narrow, compared to the configuration in which the guide block 38 is arranged in the through-hole 39*g*. Therefore, in this embodiment, even when the elevating mechanism 4 for raising and lowering the robot main body 3 is arranged outside the robot main body 3, particles generated in the drive unit 36, the guide rails 37 or the guide block 38 can effectively be prevented from entering into the EFEM 6 from the joint section between the robot main body 3 and the elevating mechanism 4.

Further, in the second embodiment, the exhaust fans 42 are attached to the housing 39 to discharge the air inside the housing 39 to the outside of the EFEM 6; therefore, particles generated at the drive unit 36, the guide rails 37, or the guide block 38 can more effectively be prevented from entering into the EFEM 6 from the joint section between the robot main body 3 and the elevating mechanism 4.

In the second embodiment, the rear surface of the housing 21 of the main body unit 17 is secured to the fixed member 41 arranged outside the housing 39. In other words, in this embodiment, the robot main body 3 and the elevating mechanism 4 can easily be connected to each other by using the flat sheet-like fixed member 41 arranged outside the housing and the back surface of the planar housing 21.

Other Embodiments

The above-described first and second embodiments are the preferred examples of the present invention; however, the embodiment is not limited to these, but can varyingly be modified within the scope of the invention.

In the above-described first embodiment, the center of rotation C1 of the first arm portion 18 is positioned farther toward the front than the center of the main body unit 17, and in the standby state of the robot 1 where the first arm portion 18, the second arm portion 19, the third arm portion 20, and the hands 14 and 15 are overlapped with each other in the up-down direction, part of the arm 16 and the hands 14 and 15 protrude farther toward the back than the main body unit 17. Also, in the above embodiment, the elevating mechanism 4 is arranged behind the main body unit 17. Beside these, the center of rotation C1 of the first arm portion 18 may be positioned farther toward the back than the center of the main body unit 17 when viewed in the up-down direction; in the standby state of the robot 1, portion of the arm 16 and the hands 14 and 15 protrude farther toward the front than the main body unit 17; and the front face of the main body unit 17 may be secured to the elevating mechanism 4 and the elevating mechanism 4 may be positioned in front of the main body unit 17. Even in this case, the robot 1 can be arranged inside the housing 10 while the back surface of the robot 1 is brought close to the back surface of the housing 10; therefore, the size of the EFEM 6 can be reduced in the front-rear direction.

Also, in the above-described first embodiment, the elevating mechanism 4 is arranged behind the main body unit 17; however, the elevating mechanism 4 may be arranged on the right or left side of the main body unit 17. Also, the elevating mechanism 4 may be positioned on the left and right sides of the main body unit 17. Even in this case, the robot 1 can be arranged inside the housing 10 while the front surface of the robot 1 is made close to the front surface of the housing 10 of the EFEM 6, or the robot 1 can be arranged inside the housing 10 while the back surface of the robot 1 is brought close to the back surface of the housing 10; therefore, the size of the EFEM 6 can be reduced in the front-rear direction. Note that when the elevating mechanism 4 is arranged at both sides of the main body unit 17, the motor 45 of the elevating mechanism 4 arranged on the right side of the main body unit 17 and the motor 45 of the elevating mechanism 4 arranged on the left side of the main body unit 17 are driven synchronously.

The elevating mechanism 4 may be positioned on the left-right sides of and behind the main body unit 17. Even in this case, the robot 1 can be arranged inside the housing 10 while the front surface of the robot 1 is made close to the front surface of the housing 10; therefore, the size of the EFEM 6 can be reduced in the front-rear direction. Note that, in this case, the motor 45 of the elevating mechanism 4 arranged on the right side of the main body unit 17, the motor 45 of the elevating mechanism 4 arranged on the left side and the motor 45 of the elevating mechanism 4 arranged behind the main body unit 17 are driven synchronously.

In the above-described first embodiment, the elevating mechanism 4 fits inside the inner circumference of the trace R of the leading edge of the first arm portion 18, as viewed in the up-down direction, when the first arm portion 18 rotates around the center of rotation C1 of the first arm portion. Beside this, the corner portion on the back face of the elevating mechanism 4 may stick out to the outer circumferential side of the trace R of the front end of the first arm portion 18 when viewed in the up-down direction. Also, in the above-described embodiment, the main body unit 17 is formed to be a rectangular parallelepiped elongated in the up-down direction; however, the main body unit 17 may be formed to be a column or a polygonal column having the hexagonal shape or octagonal shape when viewed in the up-down direction.

In the above-described first embodiment, two hands 14 and 15 are attached to the front end of the third arm portion 20; however, only one hand may be attached to the front end of the third arm portion 20. Also, in the above-described embodiment, the arm 16 is configured by three arm portions, which are the first arm portion 18, the second arm portion 19 and the third arm portion 20; however, the arm 16 may be configured by two arm portions or four or more arm portions.

Next, in the above-described second embodiment, the fixed member 41 is secured to the through-hole passing portion 40*b* in the joining member 40, and the robot main body 3 is secured to the fixed member 41. Beside this, the robot main body 3 may directly be secured to the through-hole passing portion 40*b*. Also, in the above-described embodiment, the main body portion 17 is formed in a rectangular parallelepiped shape elongated in the up-down direction; however, the main body unit 17 may be formed in a column shape. Also, the main body unit 17 may be formed to be a polygonal column having the hexagonal or octagonal shape when viewed in the up-down direction. In the above-described embodiment, the nut member 47 is fixed to one of the two joining members 40; however, the nut member 47 may be fixed to the connection member 54.

In the above-described first and second embodiments, the semiconductor wafer processing apparatus 7 is positioned behind the EFEM 6 in the semiconductor manufacturing system 5. Beside this, the semiconductor wafer processing apparatus 7 may be positioned on the right side, left side or both sides of the EFEM 6. For example, as shown by long dashed double-short dashed line in FIG. 3, the semiconductor wafer processing apparatus 7 may be positioned on the right side of the EFEM 6.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot which transfers semiconductor wafers between multiple Front Open Unifier Pods (FOUPs) arranged in a fixed direction and a semiconductor wafer processing apparatus and which configures part of an EFEM, comprising:
   a robot main body; and
   an elevating mechanism arranged outside said robot main body and structured to raise and lower said robot main body;
   wherein said robot main body comprises a hand on which said semiconductor wafers are to be mounted, an arm comprising by multiple arm portions rotatably joined with one another and to which said hand is rotatably joined to the front end thereof, a main body unit to which the base end of said arm is rotatably joined, and an arm-elevating mechanism structured to raise and lower said arm;
   wherein the first direction is the direction of arrangement of said multiple FOUPs, the second direction is the direction which orthogonally intersects with the up-down direction and said first direction, the third direction is one side of said second direction and the fourth direction is the other side of said second direction,
   the center of rotation on the base end side of said arm relative to said main body unit is located farther toward said third direction side than the center of said main body unit when viewed in the up-down direction,
   in the standby state of said industrial robot where said arm is retracted and said arm portion and said hands are overlapped with each other in the up-down direction, part of said arm is positioned farther toward said fourth direction side than said main body unit,
   said main body unit is secured to said elevating mechanism, and
   said elevating mechanism is arranged on one or both sides of said main body unit in said first direction and/or on said fourth direction side of said main body unit.

2. The industrial robot as set forth in claim 1 wherein said arm comprises a first arm portion, of which the base end is rotatably joined to said main body unit, and
   said elevating mechanism fits within the rotation area of said first arm portion with respect to said main body unit.

3. The industrial robot as set forth in claim 1 wherein said main body unit is formed such that the shape thereof when viewed in the up-down direction is a rectangular or square shape having side faces parallel to said first direction.

4. The industrial robot as set forth in claim 3 wherein the side face of said main body unit in said fourth direction side is attached to said elevating mechanism.

* * * * *